US008421815B2

(12) United States Patent
Huibers et al.

(10) Patent No.: US 8,421,815 B2
(45) Date of Patent: Apr. 16, 2013

(54) IMAGING BIT PLANE SEQUENCING USING PIXEL VALUE REPETITION

(75) Inventors: Andrew G. Huibers, Sunnyvale, CA (US); Michael T. Davis, Richardson, TX (US); Henry W. Neal, Allen, TX (US); James N. Hall, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/567,244

(22) Filed: Aug. 6, 2012

(65) Prior Publication Data

US 2012/0299952 A1 Nov. 29, 2012

Related U.S. Application Data

(62) Division of application No. 12/236,379, filed on Sep. 23, 2008, now Pat. No. 8,237,731.

(51) Int. Cl.

| | |
|---|---|
| ***G09G 5/00*** | (2006.01) |
| ***G09G 5/02*** | (2006.01) |
| ***G09G 3/16*** | (2006.01) |
| ***G09G 3/30*** | (2006.01) |
| ***H04N 5/66*** | (2006.01) |
| ***H04N 7/04*** | (2006.01) |
| ***H04N 9/64*** | (2006.01) |
| ***H04N 1/46*** | (2006.01) |
| ***G03F 3/08*** | (2006.01) |
| ***G06K 9/00*** | (2006.01) |
| ***G06K 9/36*** | (2006.01) |
| ***G06K 9/62*** | (2006.01) |
| *G06K 9/40* | (2006.01) |

(52) U.S. Cl.
USPC ........... 345/589; 345/600; 345/605; 345/691; 345/48; 345/77; 348/496; 348/557; 348/383; 348/715; 348/742; 358/515; 358/518; 358/520; 382/164; 382/170; 382/225; 382/235; 382/254

(58) Field of Classification Search .................. 345/581, 345/589–591, 600–601, 605–606, 612–613, 345/618, 530–534, 545–549, 204, 207, 690–691, 345/692, 48–51, 55, 63, 77, 84–88; 348/253–256, 348/460–461, 496–503, 557, 560, 383–384, 348/489–490, 630, 687, 715, 739, 742; 358/515, 358/518–520; 382/162, 164, 167–170, 224–225, 382/235, 254, 274–276, 299
See application file for complete search history.

(56) References Cited

U.S. PATENT DOCUMENTS

| | | | | | |
|---|---|---|---|---|---|
| 5,528,317 | A | * | 6/1996 | Gove et al. | 348/743 |
| 5,969,710 | A | * | 10/1999 | Doherty et al. | 345/693 |
| 5,986,640 | A | * | 11/1999 | Baldwin et al. | 345/596 |
| 6,064,404 | A | * | 5/2000 | Aras et al. | 345/530 |

(Continued)

*Primary Examiner* — Wesner Sajous
(74) *Attorney, Agent, or Firm* — Warren L. Franz; Wade J. Brady, III; Frederick J. Telecky, Jr.

(57) ABSTRACT

A system and method for displaying an image are provided. In one embodiment, the method includes receiving a data stream representing a frame of an image. The data stream may indicate a first color pixel cluster corresponding to a first color and a second color pixel cluster corresponding to a second color. The first color pixel cluster and the second color pixel cluster may be displayed. The first color pixel cluster may be different from the second color pixel cluster.

22 Claims, 4 Drawing Sheets

U.S. PATENT DOCUMENTS 6,272,250 B1 * 8/2001 Sun et al. ...................... 382/225
8,237,731 B2 * 8/2012 Huibers et al. ................ 345/589
2002/0030649 A1 * 3/2002 Zavracky et al. ............... 345/87
2007/0035707 A1 * 2/2007 Margulis ....................... 353/122

* cited by examiner

IMAGING BIT PLANE SEQUENCING USING PIXEL VALUE REPETITION

This application is a division of application Ser. No. 12/236,379, filed Sep. 23, 2008 (now U.S. Pat. No. 8,237,731), the entirety of which is hereby incorporated by reference.

BACKGROUND

This relates generally to display systems and, more particularly, to display systems employing data reduction by grouping pixels.

Spatial light modulators are devices that may be used in a variety of optical communication and/or video display systems. In some applications, spatial light modulators may generate an image by controlling a plurality of individual elements that control light to form the various pixels of the image. One example of a spatial light modulator is a digital micromirror device ("DMD"), sometimes known as a deformable micromirror device. At least some spatial light modulators are illuminated completely in one color at a time. For example, a spatial light modulator may first be illuminated in red light and then it may be illuminated in green light. Because each color is done individually, the more time that is devoted to a particular color or to an additional color necessarily reduces the time available for display of the remaining colors. For example, in a three-color system the spatial light modulator may only be illuminated in red light less than one-third of the time.

Each pixel of light on the screen is a combination of different colors (e.g., red, green and blue). To display the image, the spatial light modulator relies on the user's eyes to blend the different colored lights into the desired colors of the image. For example, an element of the spatial light modulator responsible for creating a purple pixel will only reflect the red and blue light to the display surface. The pixel itself is a rapidly, alternating flash of the blue and red light. A person's eyes will blend these flashes in order to see the intended hue of the projected image.

Data received from a video source may control operation of a spatial light modulator. Processing this data may require considerable bandwidth and storage capacity.

SUMMARY

A system and method for displaying an image are provided. In one embodiment, the method includes receiving a data stream representing a frame of an image. The data stream may indicate a first color pixel cluster corresponding to a first color and a second color pixel cluster corresponding to a second color. The first color pixel cluster and the second color pixel cluster may be displayed. The first color pixel cluster may be different from the second color pixel cluster.

Technical advantages of some embodiments of the present disclosure may include the ability to reduce the amount of data processed by an image data processing system without significantly reducing image quality by grouping pixels. By reducing data according to the teaching of the present invention, some electronic components that drive a modulator may be eliminated or their capacity may be reduced. For example, an image data processing system may require less expensive or fewer memory chips. It may also consume less power and operate with less frame buffer storage capacity.

Other technical advantages of the present disclosure may be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present invention, and for further features and advantages thereof, reference is now made to the following description taken in conjunction with the accompanying drawings, in which.

DETAILED DESCRIPTION OF EMBODIMENTS

Figure 1:
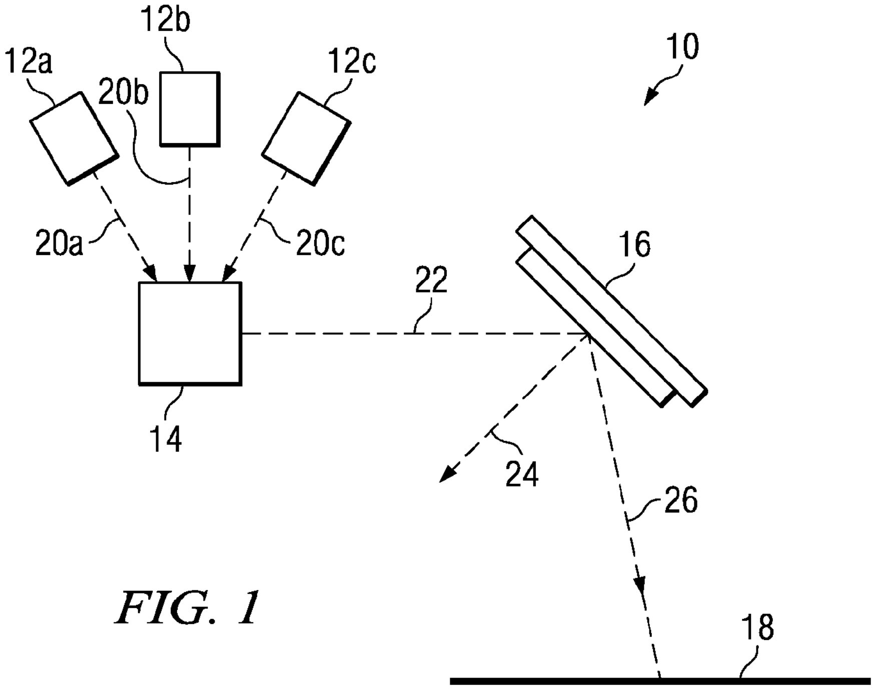
FIG. 1 is a block diagram of one embodiment of a portion of a video display system implementing pixel grouping, in accordance with particular embodiments.

FIG. 1 is a block diagram of one embodiment of a portion of a video display system implementing a pixel grouping display of an image. In this example, video display system 10 includes three light sources 12, optics 14, modulator 16 and display surface 18. In example embodiments, these components may work together to display an image having a particular pixel pattern including grouped or clustered pixels on display surface 18, as described in greater detail below with respect to FIGS. 2-4. Light beams 20 from any of three light sources 12 pass through optics 14 and emerge as projected beam 22. Projected beam 22 may be projected toward modulator 16.

Modulator 16 may then direct a portion of projected beam 22 towards a light dump along off-state light path 24 and/or a portion of projected beam 22 towards display surface 18 along on-state light path 26. In certain embodiments, modulator 16 may be illuminated by only one light source 12 at a time.

Light sources 12 may comprise any of a variety of different types of light sources, such as, for example, a metal halide lamp, a xenon arc lamp, an LED, a laser, etc. Each light source 12 may be capable of generating a respective light beam 20. Each light beam 20 may be of a different color (e.g., red, green, blue, yellow, cyan, magenta, white, etc.) or one or more colors may be repeated (e.g., there may be two red beams, one blue beam and one green beam). For example, in FIG. 1 light source 12*a* may be a red laser, light source 12*b* may be a green laser, and light source 12*c* may be a blue laser. While only three light sources 12 have been depicted, other embodiments may include additional light sources and/or additional colors. The additional colors may, for example, be used to create certain effects or to manipulate the color space.

Optics 14 may comprise a lens and/or any other suitable device, component, material or technique for bending, reflecting, refracting, combining, focusing or otherwise manipulating light beams 20 to produce projected beam 22. An active area may be a portion of modulator 16 that maps to the visible area of display surface 18 driven by modulator 16 (e.g., light incident on the active area may be directed along on-state light path 26 towards display surface 18). It may be appreciated that video display system 10 may also include additional optical components (not explicitly shown), such as, for example, lenses, mirrors and/or prisms operable to perform various functions, such as, for example, filtering, directing, reimaging, and focusing beams. For example, some embodiments may use separate optics for each light source 12.

Modulator 16 may comprise any device capable of selectively communicating, for example by selective redirection, at least some of the light from projected beam 22 along on-state light path 26 and/or along off-state light path 24. In various embodiments, modulator 16 may comprise a spatial light modulator, such as, for example, a liquid crystal display (LCD) modulator, a reflective liquid crystal on silicon (LCOS) modulator, an interferometric modulator, or a microelectromechanical system (MEMS) modulator. In particular embodiments, modulator 16 may comprise a digital micromirror device (DMD).

The DMD may be a MEMS device comprising an array of tilting micromirrors. The number of micromirrors may correspond to the number of pixels of display surface 18. From a flat state, the micromirrors may be tilted, for example, to a positive or negative angle to alternate the micromirrors between an "ON" state and an "OFF" state. In particular embodiments, the micromirrors may tilt from +10 degrees to −10 degrees. In other embodiments, the micromirrors may tilt from +12 degrees to −12 degrees, or from +14 degrees to −14 degrees.

To permit the micromirrors to tilt, each micromirror may be attached to one or more hinges mounted on support posts and spaced by means of an air gap over underlying control circuitry. The control circuitry may provide electrostatic forces based, at least in part, on image data received from an image source (e.g., a Blu-ray disc™ player or cable box). The electrostatic forces may cause each micromirror to selectively tilt. Incident light illuminating the micromirror array may be reflected by the "ON" micromirrors along ON-state light path 26 for receipt by display surface 18 or it may be reflected by the "OFF" micromirrors along OFF-state light path 24 for receipt by a light dump. The pattern of "ON" and "OFF" mirrors (e.g., light and dark mirrors) forms an image that may be projected onto a display screen 18.

Display surface 18 may be any type of screen able to display a projected image. For example, in some embodiments display surface 18 may be part of a rear projection TV. In particular embodiments, display surface 18 may be a screen used with a projector, or even simply a wall (e.g., a wall painted with an appropriate color or type of paint).

In an alternate embodiment, video display system 10 may comprise a single light source 12. Light source 12 may be projected through a color wheel that may sequentially filter the light of light source 12 into two or more colors. The color wheel may include colors red, green, and blue. It may work in conjunction with the light beam 20 to alternatively direct two or more different colors of light beam 20 toward modulator 16 at predetermined time intervals. Given these predetermined time intervals, modulator 16 may then proportionately mix each of the colors in order to produce many of the other colors within the visible light spectrum.

In another alternate embodiment, modulator 16 may be the final display surface viewed by the user, for example in a viewfinder display application.

Figure 2:
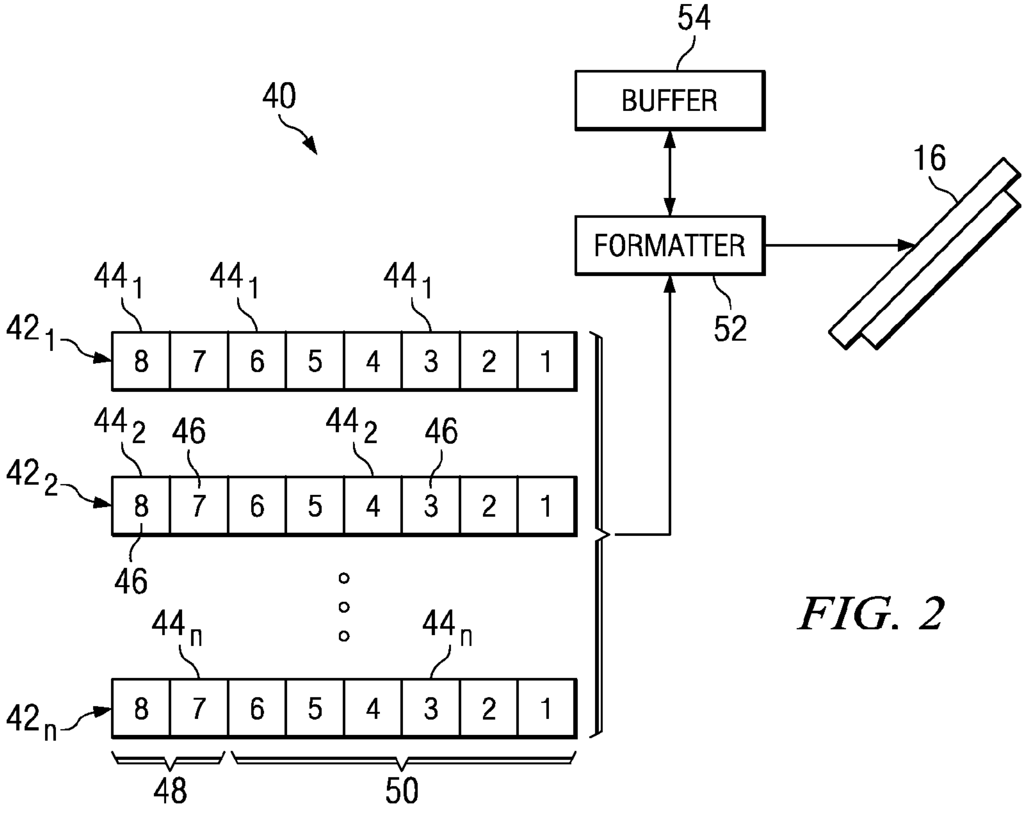
FIG. 2 is a block diagram of an image data processing system, in accordance with particular embodiments.

FIG. 2 illustrates an image data processing system 40 in accordance with an embodiment. Image data processing system 40 may include formatter 52, buffer 54, and modulator 16. Image data processing system 40 may receive image data from a video source and process it such that micromirrors on modulator 16 display an image corresponding to the video source data.

Modulator 16 may operate by a pulse width modulation (PWM) scheme. Generally, the incoming video image data signal is digitized into samples using a predetermined number of bits for each element. The predetermined number of bits is often referred to as the bit depth, particularly in systems employing binary bit weights. Generally, the greater the bit depth, the greater the number of colors (or shades of gray) modulator 16 can display.

Image data 42 may be received from a video source. Image data 42 may include multiple bit groups $\mathbf{42}_1$-$\mathbf{42}_n$. Each bit group $\mathbf{42}_1$-$\mathbf{42}_n$ may be used by image data processing system 40 to control micromirrors of modulator 16 to allow modulator 16 to display a frame of an image. Each bit group $\mathbf{42}_1$-$\mathbf{42}_n$ may correspond to a single micromirror of the array of micromirrors of modulator 16. Thus, bit group $\mathbf{42}_1$ may provide information to modulator 16 to direct the control of a single micromirror for a single color during a single frame of image data. In one embodiment, the color may be green. Thus, bit group $\mathbf{42}_1$ may control a single micromirror of modulator 16 that will direct the illumination of green light on a single pixel of display 18 during a single frame.

Bit groups $\mathbf{42}_1$-$\mathbf{42}_n$ may each be comprised of a series of bits 44. For example, bit group $\mathbf{42}_1$ may include eight bits 44, making a byte. In alternative embodiments, each of bit groups $\mathbf{42}_1$-$\mathbf{42}_n$ may include fewer than eight bits or more than eight bits. For example, bit groups $\mathbf{42}_1$-$\mathbf{42}_n$ may include six or four bits. Four bits may be sufficient to display text. Each bit 44 may have a corresponding bit plane value 46 associated with it. The higher the bit plane value 46, the greater the amount of time a pixel associated with that bit is illuminated with a particular color during the frame. More significant bits 48 may be displayed a longer amount of time during the frame (e.g., may set a micromirror to an "ON" state for a longer amount of time), while less significant bits 50 may be displayed a shorter amount of time during the frame. In particular embodiments, more significant bits may correspond to those bits with a bit plane value of seven or eight, and less significant bits 50 may correspond to bits with bit plane values of six or less.

Formatter 52 may receive image data 42 and translate it into commands that can be understood by modulator 16. Formatter 52 may be any suitable processing device, for example, an application specific integrated circuit (ASIC) or a field-programmable gate array (FPGA). In accordance with embodiments, formatter 52 may process image data 42 such that the amount of data flowing through image data processing system 40 to modulator 16 may be reduced. This reduction of data flow may allow the bandwidth of associated data buses to be reduced and may also allow buffer 54 to operate with less random access memory (RAM). In accordance with an embodiment, image data processing system 40 may operate with fewer or slower or lower cost memory chips due to the ability to process less data to display an image. In addition, the size or speed or cost of the formatter circuitry can be reduced. This reduction in data may be accomplished while continuing to maintain the quality of an image.

With conventional image display systems, image data 42 may be processed such that all of the bits $\mathbf{44}_1$ of a single bit group $\mathbf{42}_1$ are used to control only a single one of the micromirrors of modulator 16. In accordance with particular embodiments, image data 42 may be modified such that groups or clusters of more than one micromirror of modulator 16 and the display of corresponding pixels are controlled by the same bits $\mathbf{44}_1$ of a single bit group $\mathbf{42}_1$. Pixels, micromirrors and other similar devices, such as a portion of a liquid crystal cell, are herein referred to generally as pixel elements. Thus, by processing image data 42 to allow multiple micromirrors to be controlled by data that would normally control a single micromirror, data flow through image processing system 40 may be reduced. For example, the same amount of data that would be necessary to control one row of micromirrors/pixels may be used to control two adjacent rows of micromirrors/pixels. In this manner, data flow through image processing system 40 may be reduced to half.

As discussed below in conjunction with FIGS. 3A-3C and 4, this grouping of pixels may be accomplished in various ways. In one example, clustering is performed according to data corresponding to certain ones of the primary colors used to generate the color of the pixel during a given frame (e.g., red, green, and blue). Reduction of data usage may also be accomplished by loading bits having lower bit plane values in clusters. However, bits 44 with higher bit plane values should be loaded for each distinct pixel element because the effect of a change in their value is much more significant than those with lower bit plane values 46. By loading bits in this manner, bits 44 associated with lower bit plane values may control a corresponding group of micromirrors/pixels. In addition, pixel clusters may be displayed in a first subframe of an image frame. A second pixel cluster corresponding to the same image as the first pixel cluster may be displayed in a second subframe. This display in the second subframe may be offset from the display in the first subframe to create an on-chip smoothing, as discussed in greater detail below.

Figure 3A:
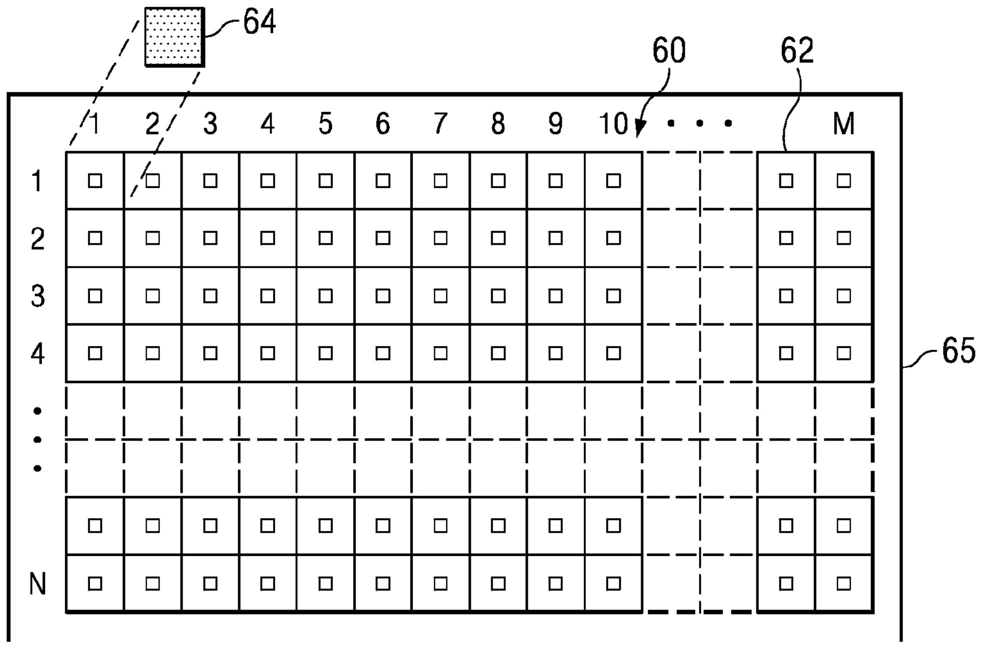
FIG. 3A illustrates a single pixel cluster, in accordance with particular embodiments.
Figure 3B:
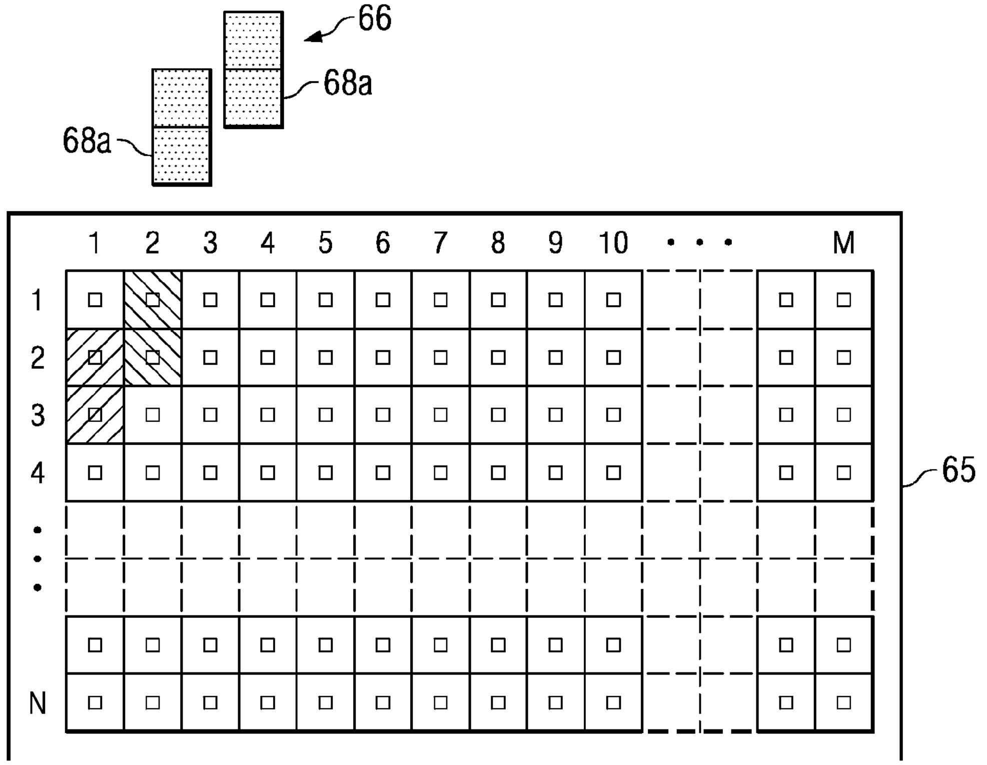
FIG. 3B illustrates a double pixel cluster, in accordance with particular embodiments.
Figure 3C:
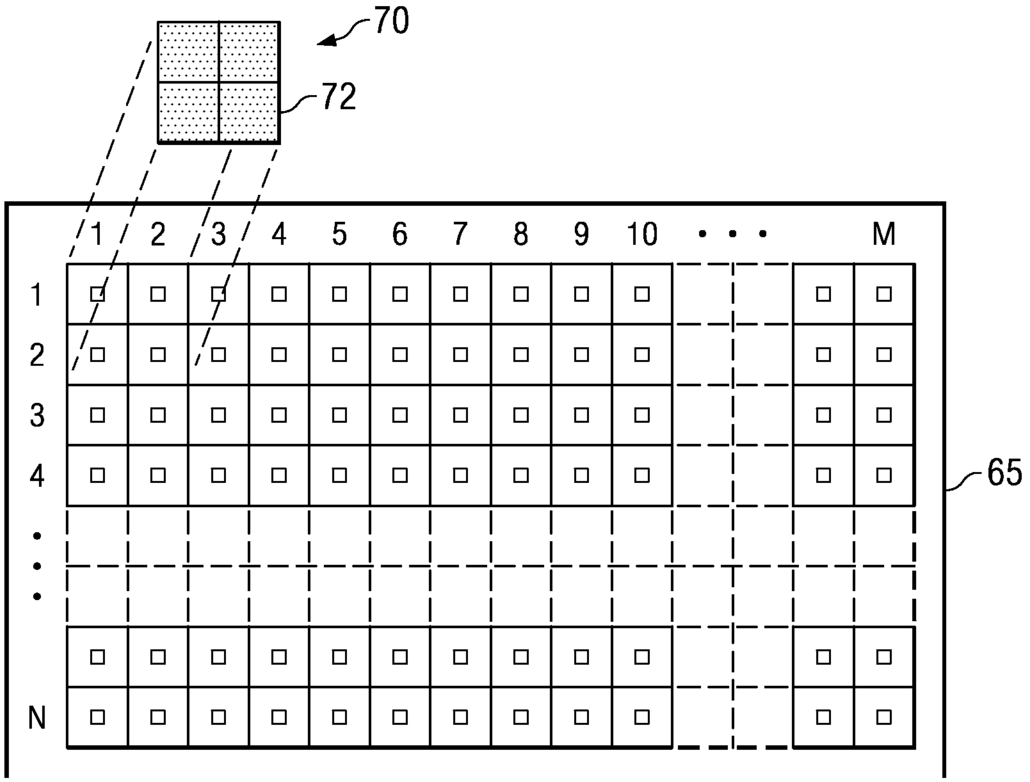
FIG. 3C illustrates a quad pixel cluster, in accordance with particular embodiments.

FIGS. 3A, 3B, and 3C, each illustrates different pixel clusters which make up pixel patterns in accordance with embodiments. As used herein, one or more than one pixel may make up a pixel cluster. FIG. 3A illustrates display 65. Display 65 includes pixel array 60. Pixel array 60 may include M columns by N rows of pixels. Modulator 16 shown in FIGS. 1 and 2 may include an array of micromirrors corresponding to pixel array 60. FIG. 3A illustrates a single pixel cluster 64.

Image data may be received by image data processing system 40 for display on display 65. Image data 42 may correspond to a frame of a frame sequential color image or video sequence. Image data 42 may also direct the display of certain colors of the image. For example, image data 42 may direct the display of different shades (lightness quantities) and/or different combinations of each of the colors green, red, and blue. In accordance with embodiments, pixels 62 may be grouped into particular pixel clusters depending upon the color that image data 42 represents. For example, image data 42 that represents the color green may be loaded to image data processing system 40 in accordance with a 1×1 single pixel cluster and corresponding display resolution resulting in single pixel cluster 64. That is, when display 65 displays a green portion of an image, it may have an image resolution made up of an array of 1×1 pixel clusters 64 forming a single pixel pattern across display 65. This corresponds to a conventional approach.

Data reduction may be achieved in connection with display 65 showing red or blue portions, for example, of an image frame. Thus, when image data 42 is loaded into image data processing system 40 that corresponds to the colors red or blue, the pixels may be grouped into double pixel clusters 68*a*, a group of which may form double pixel pattern 66 as shown in FIG. 3B. Accordingly, image data 42 needed to display red and blue on display 65 may be reduced to half. By maintaining the green image data as a single pixel pattern and allowing the red and blue data to be displayed in a double pixel pattern, data processed by image data processing system 40 may be reduced while maintaining image quality. This particular pixel pattern 66 in FIG. 3B is offset, as described in greater detail below.

Other embodiments may allow red data to be reduced by half, resulting in a double pixel pattern 66, while blue data is reduced four times, resulting in quad pixel pattern 70 shown in FIG. 3C. That is, in certain embodiments, a single image frame may display green data as a single pixel pattern with an array of 1×1 pixel clusters. The same image frame may display red data in a double pixel pattern 66 with 1×2 pixel clusters 68*a*, and in the same image frame, blue data may be displayed in quad pixel pattern 70 resulting in 2×2 quad pixel clusters 72.

Figure 3D:
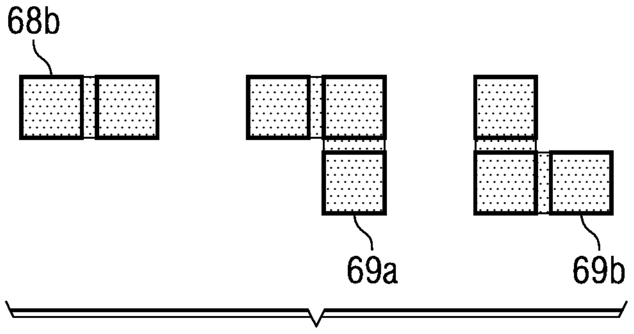
FIG. 3D illustrates double and triple pixel clusters.

FIG. 3D illustrates other pixel clusters in accordance with embodiments. Double pixel cluster 68*b* may be similar to double pixel cluster 68*a* but oriented in a horizontal direction. Triple pixel clusters 69*a* and 69*b* are clusters of three adjacent pixels and may be configured in the orientations shown.

The groupings of the pixel clusters may be offset as double pixel pattern 66 as shown in FIG. 3B. This offset may allow the image to be displayed without visible lines running horizontally through the image that may otherwise result if the grouping is merely done by grouping rows 1 and 2 as a first group and rows 3 and 4 as a second group. This grouping without an offset may result in a line visible on the image between rows 2 and 3. Offsetting, such that a first pixel cluster 68*a* corresponds to column 1, pixels 2 and 3 and a second pixel cluster 68*a* corresponds to column 2, rows 1 and 2, may avoid unwanted horizontal lines through an image. The offset may be a single pixel as shown.

Colors may be selected for data reduction based on the luminance and/or the amount of time the color is to be displayed per frame. For example, a green LED may be the least efficient so it may need to be left on the longest. Red may be more efficient than green, and blue may be more efficient than red. Green, red, then blue may also be the order of luminance or perceived brightness of the colors. When loading the pulse width modulation data, due to the luminance and the amount of time the color needs to remain ON during the frame, it may be possible to load more bits in green than red, and more bits in red than blue. Accordingly, data reduction in accordance with an embodiment of the present disclosure may include a single pixel pattern may correspond to green, a double pixel pattern may correspond to red, and a quad pixel pattern may correspond to blue. However, other patterns and other colors may be used.

As is well known with display systems employing frame sequential color, during a single image frame the display of the colors may be divided into percentages of time the color is illuminated on display 65 to effect the appearance of a chosen color for that pixel for that frame, such as purple. For example, green may use approximately 50% of the time of the frame, red may use approximately 30% of the time of the frame, and blue may use approximately 20% of the time of the frame. Because green may be on for half of the frame time, there may be more time to load more data. This may correspond to the ability to load data corresponding to each pixel for green and being able to reduce the amount of data by grouping the pixels for red and blue. The teachings of the present invention could be used with more than just green, red and blue colors. For example, other color fields may be narrowband colors (e.g., orange) or combinations of single colors such as, for example, cyan which is a combination of green and blue.

After the image data 42 is processed to allow data reduction, it may be stored in buffer 54 before it is transmitted to modulator 16. Because the data is reduced before it is stored in buffer 54, buffer 54 may be allowed to have less capacity, and thus be cheaper, resulting in an overall less expensive image display system 40.

In accordance with another embodiment, overlapping images of the same color may be loaded with different pixel groupings based on bit plane value 46. For example, less significant bits 50 may be loaded in groups, while more significant bits 48 may be loaded one at a time. This may result in a 1×1 pixel cluster for more significant bits, which may correspond to bit plane values 46 of 7 and 8, in one example. Data in bit planes 7 and 8 may correspond to progressively longer duration pixel state settings. In a binary weighting scheme, each bit plane may correspond to approximately twice the time of the next shorter bitplane, but other weightings are frequently used. Bit plane values 46 of six or less may be less significant bits, and may be loaded in groups of four bits as depicted in FIG. 3C showing quad pixel cluster 72.

When grouping is done by bit plane in accordance with an embodiment, bits with bit plane values of 7 and 8 may control a single micromirror of modulator 16 and corresponding pixel 62, while less significant bits corresponding to bit plane values of 1 through 6 may control a group of micromirrors corresponding to pixel clusters 68*a* and 72. These groupings may be double pixel cluster 68*a* as shown in FIG. 3B or quad pixel cluster 72 as shown in FIG. 3C. More significant bits may correspond to a single pixel because the loading time of the more significant bits is higher than the load time for the less significant bits.

The data reduction techniques described herein may be combined with more conventional data reduction techniques, such as reducing bits per pixel. For example, data reduction techniques described herein may be combined with the data corresponding to six bits or four bits per pixel resulting in even more data reduction. Moreover, pixel grouping is not limited to double or quad pixel grouping, but rather any suitable number of pixels may be grouped. For example, certain embodiments may employ data reduction by grouping three pixels.

Figure 4:
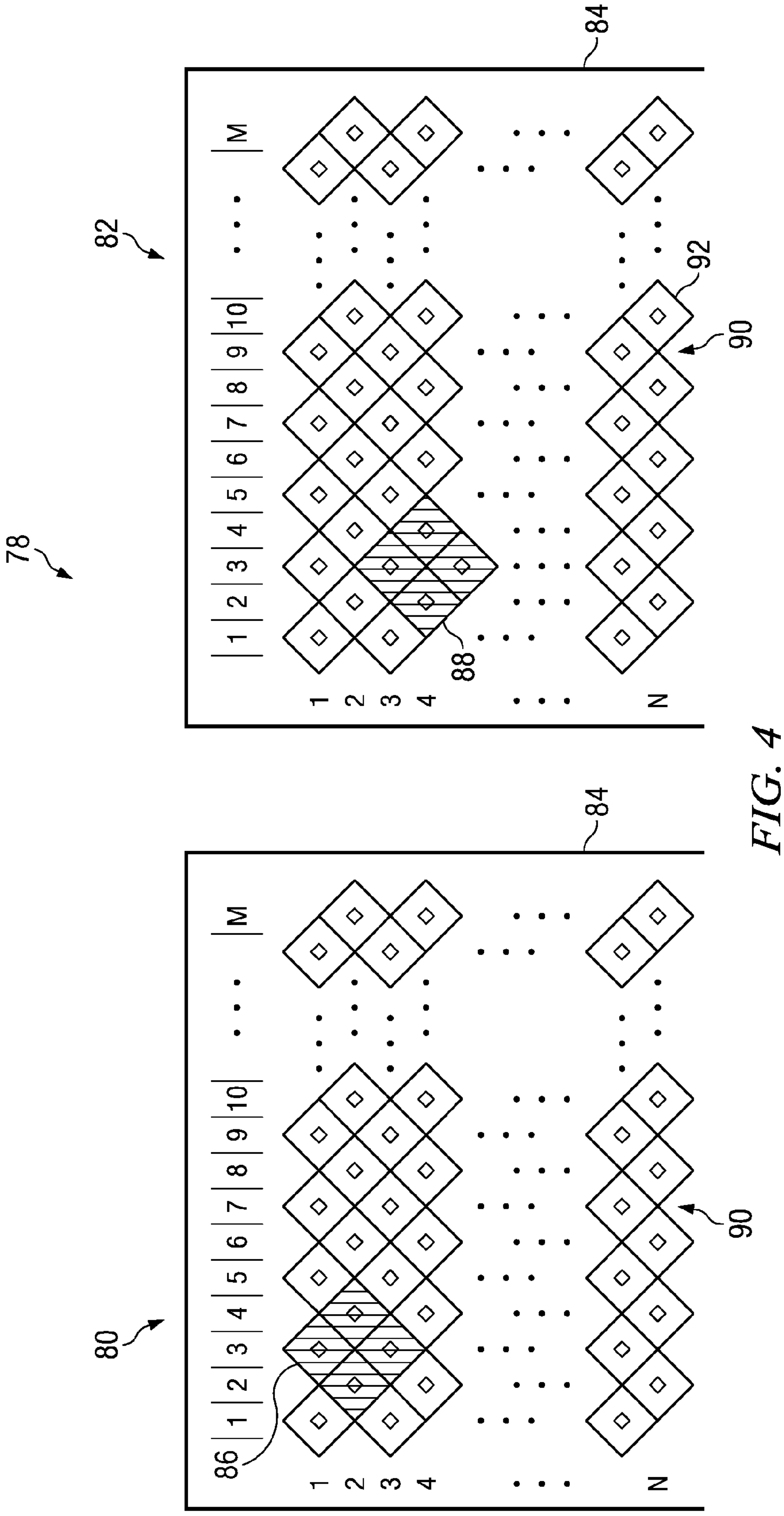
FIG. 4 illustrates a sequence for mapping clusters of image data in separate subframes, in accordance with particular embodiments.

FIG. 4 illustrates a sequence 78 that may be followed to produce on-chip smoothing of the display, such as SmoothPicture™ technology used with Texas Instruments products, using pixel groupings in accordance with embodiments of the present disclosure. Conventional smoothing technology, which employs an optical actuator to display two or more pixel fields sequentially with different offsets to increase effective image resolution, is well known in the art.

Display 84 may be comprised of pixel array 90. Pixel array 90 may include M columns and N rows of pixels 92. In order to create a virtual smoothing effect, a first pixel cluster or superpixel 86 may comprise four pixels that are grouped and controlled with corresponding image data in accordance with embodiments. A first superpixel 86 may be displayed in a first subframe 80 of a corresponding image frame. The image frame may comprise first subframe 80 and second subframe 82. At a subsequent point in time, a second superpixel 88 corresponding to the same image of first superpixel 86 may be displayed in second subframe 82. The display of second superpixel 88 may be offset a full pixel from the display of first superpixel 86. This sequential display of a second superpixel 88 offset from a first superpixel may create a virtual smoothing effect. In accordance with an embodiment, a similar result may be accomplished merely by loading a second superpixel 88 offset in a second subframe 82 offset from a first superpixel 86 in a first subframe 80. A pixel array 90 of on-chip smoothing sequence 78 may be a diagonal (sometimes referred to as a diamond) array as illustrated in FIG. 4.

In an alternate embodiment, pixel array 90 may be an orthogonal array as illustrated in FIGS. 3A-3C.

It should be understood that various modifications may be made to the described embodiments without departing from the spirit and scope of the invention as defined by the appended claims.

What is claimed is:

1. A method for generating a bit plane color sequence for a frame sequential color image display system, the method comprising:

at a processing device, receiving an input data stream representing imaging data for display of a frame of an image during a frame display time, the data stream comprising successive groups of n bits of data for each of m component colors for each pixel of the image;

wherein n is a positive integer greater or equal to four and m is a positive intger greater or equal to two;

determining relative lengths of the frame display time needed for display of each of the respective m component colors, based on relative luminance available from an illumination source for display of that component color using weighted bit plane pulse width modulation based on n bits of data;

for the one component color having a longest relative length, displaying that one component color of the image using a weighted bit plane sequence for each pixel with the pixel values for the bit planes determined by the n bits of data on a one-to-one correspondence with the n bits of data for that one component color for the pixels in the input data stream; and for at least one other component color having a relative length less than the longest relative length, displaying that at least one other component color of the image using a weighted bit plane sequence for each pixel with the pixel values for one or more bit planes determined by the n bits of data on a multiple pixel grouping-to-one correspondence with the n bits of data for that at least one other component color for designated ones of the pixels in the input data stream.

2. The method of claim 1, wherein the at least one other component color is displayed with the pixel values for the one or more bit planes determined using data for pixels of a row of pixels repeated for pixels of at least one other row of pixels.

3. The method of claim 2, wherein the data for pixels of the row of pixels is repeated for the pixels of the at least one other row of pixels with an offset.

4. The method of claim 1, wherein the multiple pixel grouping-to-one correspondence is a two pixel grouping-to-one correspondence.

5. The method of claim 4, wherein the one component color is green, and the other component color is at least one of red or blue.

6. The method of claim 1, wherein the multiple pixel grouping-to-one correspondence is a four pixel grouping-to-one correspondence.

7. The method of claim 6, wherein the one component color is at least one of green or red, and the other component color blue.

8. The method of claim 1, wherein displaying the at least one other component color comprises displaying first and second other component colors; the multiple pixel grouping-to-one correspondence for the first other component color is a four pixel grouping-to-one correspondence; and the multiple pixel grouping-to-one correspondence for the second other component color is a four pixel grouping-to-one correspondence.

9. The method of claim 8, wherein the second other component color has a relative length less than the relative length of the first other component color.

10. The method of claim 7, wherein the one component color is green, the first other component color is red, and the second other component color is blue.

11. The method of claim 1, wherein the at least one other component color is displayed with the pixel values for bit planes corresponding to a less significant bit determined using the multiple pixel grouping-to-one correspondence, and the pixel values for bit planes corresponding to a more significant bit determined using the one-to-one correspondence.

12. The method of claim 1, wherein displaying the one component color and the at least one other component color includes loading the respective bit plane pixel values into a display buffer.

13. The method of claim 12, wherein the respective bit plane pixel values loaded into the display buffer are transmitted to set individual modulator elements of a spatial light modulator.

14. The method of claim 13, wherein the individual modulator elements are mirrors of a digital micromirror device (DMD).

15. A method for generating a bit plane color sequence for a frame sequential color image display system, the method comprising:

at a processing device, receiving an input data stream representing imaging data for display of a frame of an image during a frame display time, the data stream comprising successive groups of 8 bits of data for each of red, green and blue component colors for each pixel of the image;

displaying the green component color of the image using a weighted bit plane sequence for each pixel with the pixel values for the bit planes determined by the 8 bits of data on a one-to-one correspondence with the 8 bits of data for the green component color for the pixels in the input data stream;

for at least one of the red or blue component color, displaying that at least one of the red or blue component color of the image using a weighted bit plane sequence for each pixel with the pixel values for the bit planes determined by the 8 bits of data on a two-to-one or greater than two-to-one correspondence with the 8 bits of data for that at least one of the red or blue component color for designated ones of the pixels in the input data stream.

16. The method of claim 15, wherein the at least one of the red or blue component color comprises both of the red and blue component colors.

17. The method of claim 16, wherein the pixel values for the red component color are determined on a two-to-one correspondence and the pixel values for the blue component color are determined on a greater than two-to-one correspondence.

18. The method of claim 17, wherein the greater than two-to-one correspondence is a four-to-one correspondence.

19. The method of claim 15, wherein the at least one of the red or blue component color is displayed with the pixel values for the bit planes determined using data for pixels of some rows of pixels repeated for other rows of pixels.

20. The method of claim 19, wherein the repeated pixel values are repeated for the other rows with an offset.

21. The method of claim 15, wherein the green and the at least one of the red or blue component colors are displayed by loading the respective bit plane pixel values into a display buffer.

22. The method of claim 21, wherein the respective bit plane pixel values loaded into the display buffer are transmitted to set individual modulator elements of a spatial light modulator.

* * * * *